(12) United States Patent
Okuhata

(10) Patent No.: US 9,461,587 B2
(45) Date of Patent: *Oct. 4, 2016

(54) FM RECEIVER THAT RECEIVES FM SIGNAL AND METHOD FOR RECEIVING FM SIGNAL

(71) Applicant: JVC KENWOOD Corporation, Yokohama-shi (JP)

(72) Inventor: Yasuhide Okuhata, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 49 days.

This patent is subject to a terminal disclaimer.

(21) Appl. No.: 14/522,299

(22) Filed: Oct. 23, 2014

(65) Prior Publication Data

US 2015/0188493 A1 Jul. 2, 2015

(30) Foreign Application Priority Data

Dec. 27, 2013 (JP) .................. 2013-271531

(51) Int. Cl.
*H04B 1/16* (2006.01)
*H03D 3/22* (2006.01)
*H03D 3/00* (2006.01)

(52) U.S. Cl.
CPC ............. *H03D 3/22* (2013.01); *H03D 3/004* (2013.01); *H04B 1/1646* (2013.01)

(58) Field of Classification Search
CPC ........... H04B 1/04; H04B 1/16; H04L 27/14; H04L 27/16; H03D 3/00; H03D 3/004; H03D 3/22; H03D 3/242

USPC ................... 455/192.1, 192.2, 205, 208, 214
See application file for complete search history.

(56) References Cited

U.S. PATENT DOCUMENTS

| | | | | |
|---|---|---|---|---|
| 4,158,211 A * | 6/1979 | Masuda | ................... | H04N 5/50 331/32 |
| 4,365,349 A * | 12/1982 | Ogita | .................... | H03J 5/0281 455/182.2 |
| 5,237,419 A * | 8/1993 | Jarick | ...................... | H04N 7/10 348/723 |
| 8,055,225 B2 * | 11/2011 | Ojima | .................. | H04B 1/1027 455/205 |
| 8,260,233 B2 * | 9/2012 | Kobayashi | ........... | H04B 1/1036 455/214 |
| 2015/0236878 A1* | 8/2015 | Okuhata | ............. | H04L 25/0262 455/209 |

FOREIGN PATENT DOCUMENTS

JP       09-139900 A       5/1997

* cited by examiner

*Primary Examiner* — Quochien B Vuong
(74) *Attorney, Agent, or Firm* — Venable LLP; Michael A. Sartori

(57) ABSTRACT

A quadrature detector quadrature-detects an FM signal. An FM detector generates a detection signal by FM detecting an FM signal that has been quadrature-detected. An AFC unit generates a control signal for controlling a frequency of a local oscillation signal used for quadrature detection on the basis of the generated detection signal, and feeds back the control signal to a local oscillator that should output the local oscillation signal. A difference calculator generates a difference signal representing a difference from a reference value on the basis of the generated detection signal. An addition unit adds the generated difference signal and the generated detection signal.

3 Claims, 4 Drawing Sheets

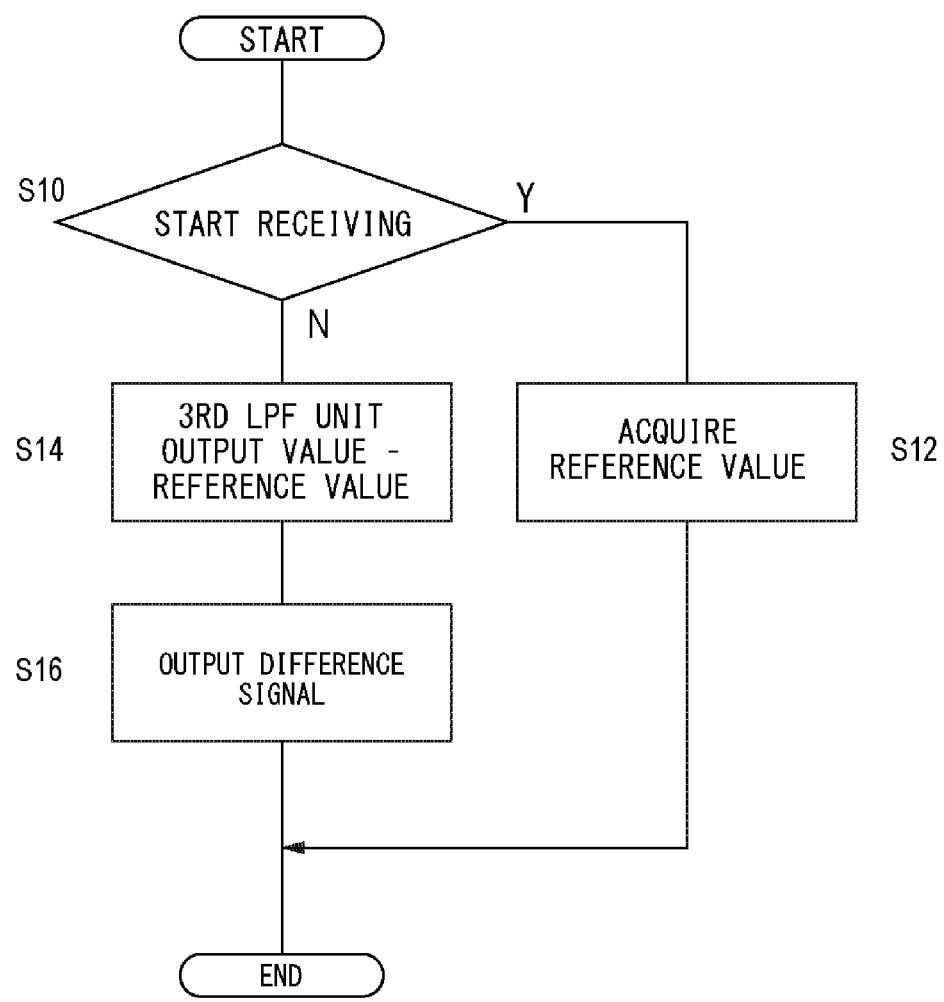

FM RECEIVER THAT RECEIVES FM SIGNAL AND METHOD FOR RECEIVING FM SIGNAL

CROSS-REFERENCE TO RELATED APPLICATION

This application is based upon and claims the benefit of priority from the prior Japanese Patent Application No. 2013-271531, filed on Dec. 27, 2013, the entire contents of which are incorporated herein by reference.

BACKGROUND

1. Field

The present invention generally relates to a reception technology, and more particularly, to an FM receiver that receives an FM signal and method for receiving an FM signal.

2. Description of the Related Art

If an FM signal detected by an FM receiver is interfered by a buzz beat or the like, the quality of the signal is deteriorated. In order to deal therewith, in a television signal receiving circuit of intercarrier signal detection scheme, a buzz component included in an audio signal is canceled by adding a PM component that is quadrature-detected by an automatic frequency regulator circuit to an audio signal acquired by an audio detector circuit.

In an FM receiver comprising a quadrature detection device of direct conversion scheme or the like, a beat noise after the FM detection occurs. In order to reduce the effects thereof, a DC component of a FM detection signal (i.e., a frequency difference between a detected RF signal and a local oscillation signal) is detected for example by Automatic Frequency Control (AFC).

Further, by the detected frequency difference, the frequency of the local oscillator is adjusted so that the frequency is equal to the frequency of the detected RF signal. This reduces the frequency difference df, thus the frequency of beat noise is also reduced, and the beat noise becomes harder to hear as a sound.

Meanwhile, tone squelch, such as a Continuous Tone Coded Squelch System (CTCSS), a Digital-Coded Squelch (DCS), or the like is sometimes used for a walkie-talkie for business use. These tone squelches use a signal having a frequency lower than that of the audible band. Therefore, if the AFC described above is used for a tone squelch, since the AFC follows a signal for the tone squelch, the signal for the tone squelch after FM detection is attenuated and/or distorted. As a result thereof, the squelch malfunctions.

SUMMARY

In this background, a purpose of the present invention is to provide a technology for reducing the effect of beat noise in a FM-detected signal.

In order to address the aforementioned issue, an FM receiver is provided according to an aspect of the present invention. The FM receiver includes: a quadrature detection device that quadrature-detects an FM signal; an FM detector that generates a detection signal by FM detecting an FM signal that has been quadrature-detected in the quadrature detection device; an AFC unit that generates a control signal for controlling a frequency of a local oscillation signal used in the quadrature detection device on the basis of the detection signal generated in the FM detector, and feeds back the control signal to a local oscillator that should output the local oscillation signal; a difference calculator that generates a difference signal representing a difference from a reference value on the basis of the detection signal generated in the FM detector; and an addition unit that adds the difference signal generated in the difference calculator and the detection signal generated in the FM detector.

According to another aspect of the present invention, a method for receiving an FM signal is provided. The method includes: quadrature-detecting an FM signal; generating a detection signal by FM detecting an FM signal that has been quadrature-detected; generating a control signal for controlling a frequency of a local oscillation signal used in the quadrature-detecting on the basis of the generated detection signal, and feeding back the control signal to a local oscillator that should output the local oscillation signal; generating a difference signal on the basis of the generated detection signal; and adding the generated difference signal and the generated detection signal.

Optional combinations of the aforementioned constituting elements, and implementations of the invention in the form of methods, apparatuses, systems, recording mediums, computer programs, or the like may also be practiced as additional modes of the present invention.

BRIEF DESCRIPTION OF THE DRAWINGS

FIG. 5 shows a flowchart indicating a procedure of reception by the receiver shown in FIG. 1.

DETAILED DESCRIPTION

The invention will now be described by reference to the preferred embodiments. This does not intend to limit the scope of the present invention, but to exemplify the invention.

First, a general description will be given before a more concrete explanation. An exemplary embodiment relates to an FM receiver that detects an FM signal for a tone squelch by a direct conversion. It this embodiment, quadrature detection is executed in an analog fashion, and FM detection is executed digitally. In an analog device, because of an error, an origin for a quadrature detection device and an origin for an FM detection device do not completely agree with each other, and it is also difficult to set the orthogonality of the quadrature detection device to 90 degrees completely. If the origins do not agree with each other and if the frequency of a received signal that is not modulated and the oscillation frequency of a local oscillator are out of synchronization, a demodulated signal oscillates depending on a phase. This corresponds to a beat noise. In case that quadrature detection is performed after the conversion to an intermediate frequency that is lower than the radio frequency not by a direct conversion scheme but by a heterodyne scheme, the quadrature detection can also be processed digitally. In this case, problems such as a disagreement of origins, a deviation from orthogonality do not occur and a beat noise does not occur either.

In order to reduce beat noises, synchronization of the frequency of a received signal that is not modulated and the oscillation frequency of a local oscillator is required as a sufficient condition. AFC for this purpose controls the oscillation frequency of the local oscillator so that a DC offset of an FM detection signal becomes zero. A transfer function of feedback control is defined so that the AFC does not respond to a signal modulated by a normal audio signal. Typically, an audio frequency of an audio signal is said to be between 300 Hz and 3000 Hz. In case of FM communication, sometimes various types of control signals are superimposed on a signal having a frequency of 300 Hz or less. These control signals correspond to low speed data, such as a CTCSS and/or a DCS. However, since a control signal having a frequency of 300 Hz or less is also responded to by the AFC, a control signal component tends to decrease.

In order to deal therewith, an FM receiver according to the exemplary embodiment controls the frequency of a local oscillator by executing AFC on the basis of an FM detection signal, and adds a control signal of the AFC to the FM detection signal. This addition increases a control signal component, which has been attenuated.

Figure 1:
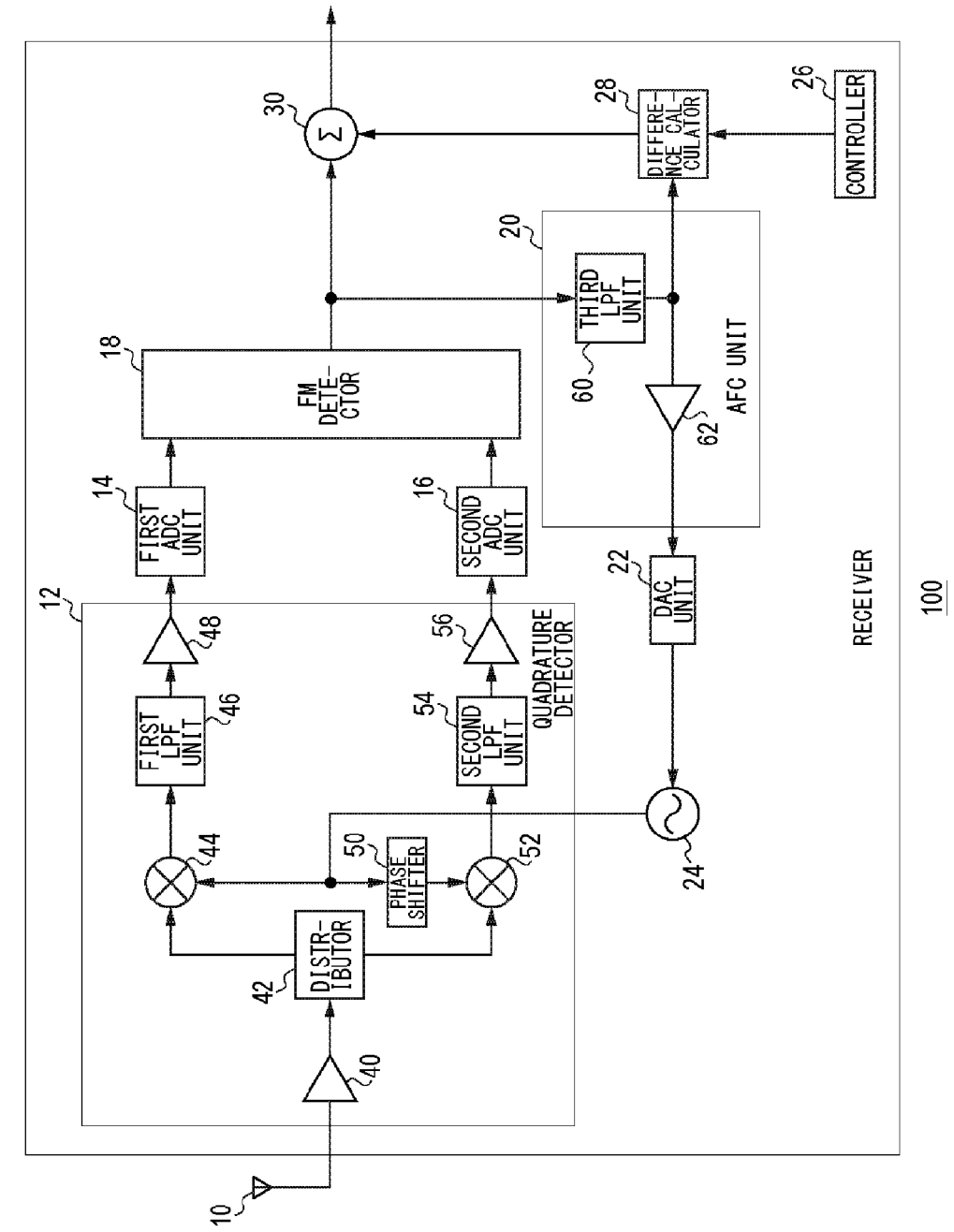
FIG. 1 shows the configuration of a receiver according to an exemplary embodiment.

FIG. 1 shows a structure of a receiver 100 according to an exemplary embodiment. The receiver 100 includes an antenna 10, a quadrature detector 12, a first ADC unit 14, a second ADC unit 16, an FM detector 18, an AFC unit 20, a DAC unit 22, a local oscillator 24, a controller 26, a difference calculator 28, and an addition unit 30. The quadrature detector 12 includes a first amplifier 40, a distributor 42, a first mixer 44, a first LPF unit 46, a second amplifier 48, a phase shifter 50, a second mixer 52, a second LPF unit 54, and a third amplifier 56. The AFC unit 20 includes a third LPF unit 60 and a fourth amplifier 62.

The antenna 10 receives a Radio Frequency (RF) signal from a transmitter (not shown). Frequency modulation has been performed on the RF signal, and tone squelch, such as a Continuous Tone Coded Squelch System (CTCSS), a Digital-Coded Squelch (DCS), or the like is used for the RF signal. The antenna 10 outputs the received RF signal to the first amplifier 40. The first amplifier 40 is a Low Noise Amplifier (LNA) and amplifies the RF signal from the antenna 10. The first amplifier 40 output the amplified RF signal to the distributor 42. The distributor 42 splits the RF signal from the first amplifier 40 into two signals. The distributor 42 outputs the split RF signals to the first mixer 44 and the second mixer 52, respectively.

The local oscillator 24 adjusts the frequency of a local oscillation signal in accordance with a control signal from the DAC unit 22, and outputs the local oscillation signal of which the frequency is adjusted to the first mixer 44 and the phase shifter 50. In this process, the local oscillator 24 adjusts the frequency of the local oscillation signal so that the higher the voltage of a control signal is, the higher the frequency of the local oscillation signal is. The phase shifter 50 shifts the phase of the local oscillation signal from the local oscillator 24 by 90 degrees. The phase shifter 50 outputs the local oscillation signal of which the phase is shifted to the second mixer 52.

The first mixer 44 generates an in-phase component signal of a baseband (hereinafter referred to as an "I signal") by multiplying the RF signal from the distributor 42 by the local oscillation signal from the local oscillator 24. The first mixer 44 outputs the I signal to the first LPF unit 46. The second mixer 52 generates a quadrature component signal of a baseband (hereinafter referred to as a "Q signal") by multiplying the RF signal from the distributor 42 by the local oscillation signal from the phase shifter 50. The second mixer 52 outputs the Q signal to the second LPF unit 54.

The first LPF unit 46 performs band limitation by filtering out a signal of which the frequency is equal to or higher than a cutoff frequency from an I signal from the first mixer 44. The first LPF unit 46 outputs an I signal of a low-frequency component (hereinafter this component is also referred to as an "I signal") to the second amplifier 48. The second LPF unit 54 performs band limitation by filtering out a signal of which the frequency is equal to or higher than a cutoff frequency from a Q signal from the second mixer 52. The second LPF unit 54 outputs a Q signal of a low-frequency component (hereinafter this component is also referred to as a "Q signal") to the third amplifier 56. The second amplifier 48 amplifies the I signal from the first LPF unit 46 and outputs the amplified I signal to the first ADC unit 14. The third amplifier 56 amplifies the Q signal from the second LPF unit 54 and outputs the amplified Q signal to the second ADC unit 16. The quadrature detector 12 is an analog device, and is implemented, for example, on one chip.

Figure 2:
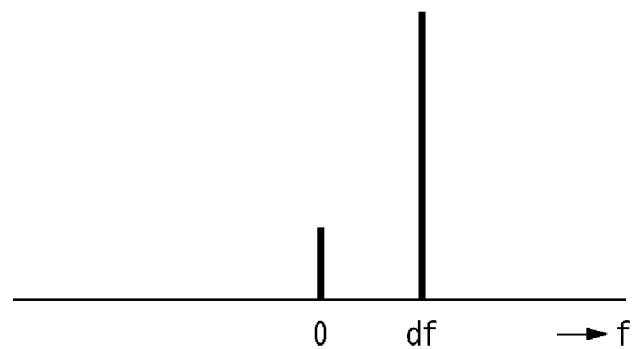
FIG. 2 shows a spectrum of a signal output from a quadrature detector shown in FIG. 1.

The quadrature detector 12 executes a direct conversion. In case that the first mixer 44, the second mixer 52, the second amplifier 48, and the third amplifier 56 are configured as an analog circuit, an unnecessary DC component occurred therefrom are superimposed on the I signal and the Q signal. FIG. 2 shows a spectrum of a signal output from the quadrature detector 12. In this figure, a spectrum of an I signal and a Q signal is shown in case that an RF signal is not modulated and a frequency difference df exists between the RF signal and a local oscillation signal. The unnecessary DC component occurred in the quadrature detector 12 is observed at 0 Hz and the RF signal is observed at df Hz. An explanation will be continued while referring back to FIG. 1.

In response to the I signal from the second amplifier 48, the first ADC unit 14 performs an analog-digital conversion. The first ADC unit 14 outputs a signal obtained by the digital conversion of the I signal (hereinafter the resultant signal is also referred to as an "I signal") to the FM detector 18. In response to the Q signal from the third amplifier 56, the second ADC unit 16 performs an analog-digital conversion. The second ADC unit 16 outputs a signal obtained by the digital conversion of the Q signal (hereinafter the resultant signal is also referred to as a "Q signal") to the FM detector 18.

The FM detector 18 FM-detects the I signal and the Q signal, that is, FM signals that are quadrature-detected. As the FM detection, for example, Arctan detection is performed. In the Arctan detection, the I signal and the Q signal are assumed to be two sides of a triangle respectively, and the angle therebetween is derived. The change of an angle per unit of time corresponds to an angular velocity (i.e., a frequency). Therefore, the demodulation of frequency modulation is enabled.

Figure 3:
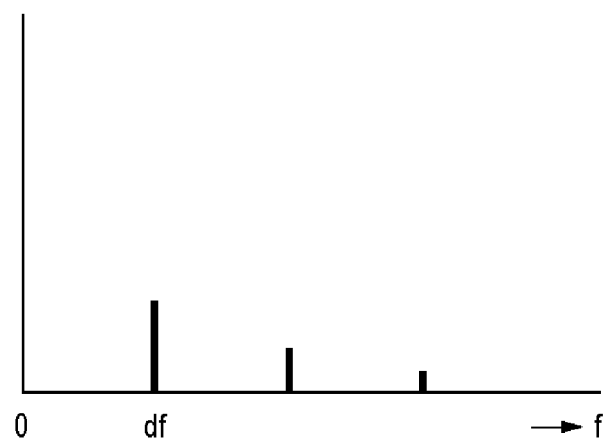
FIG. 3 shows a spectrum of a signal output from an FM detector shown in FIG. 1.

FIG. 3 shows a spectrum of a signal output from the FM detector 18. As shown in the figure, a beat noise occurs at the frequency df and at the harmonics thereof by the unnecessary DC component. As described, in case that an RF signal is not modulated and that a frequency difference df exists between the RF signal and a local oscillation signal, an unnecessary DC component occurred in the quadrature detector 12 is superimposed on an I signal and a Q signal and a beat noise is observed in a detection signal. Respective origins on Cartesian coordinate systems for an I signal and a Q signal from the quadrature detector 12, and for the FM detector 18 do not necessarily agree with one another. This is because a direct conversion chip constituting the quadrature detector 12 operates in an analog mode, which results in variations. The magnitude of the difference between positions of the origins of the quadrature detection and the FM detection is proportional to the sound volume of the beat noise, and the difference of frequencies becomes the basic frequency of the beat frequency.

If a heterodyne scheme is used instead of the direct conversion as the quadrature detector 12, the quadrature detection device can be digitized because the frequency thereof is low. In this case, offset difference between the quadrature detection device and the FM detection device never occurs. However, in case that an analog direct conversion is performed and Arctan detection is performed, a beat noise due to the frequency difference occurs. Therefore AFC is required to reduce the frequency difference in this case.

Figure 4A:
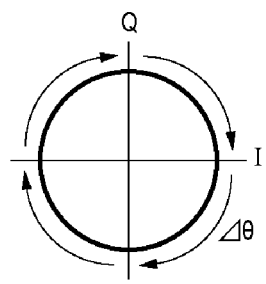
FIGS. 4A, 4B, 4C, and 4D show a general outline of the operation of the FM detector shown in FIG. 1.
Figure 4B:
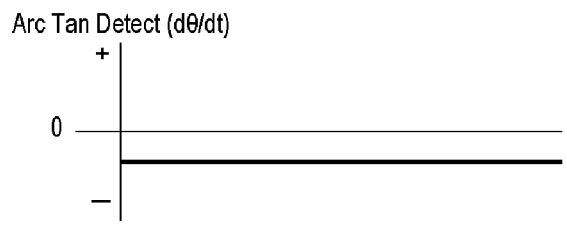

A more detailed explanation will be given below on the operation of the FM detector 18. FIGS. 4A, 4B, 4C, and 4D show a general outline of the operation of the FM detector 18. FIG. 4A shows a constellation in case that the origin of the quadrature detector 12 and the origin of the FM detector 18 coincide with each other. If the frequencies of an RF signal and a local oscillation signal deviate from each other, a point on the Cartesian coordinate system rotates at a speed according to the deviation of the frequencies. FIG. 4B shows the time variation a detection signal. If the deviation of the frequencies is constant, the rotation speed is constant. Since the Arctan detection detects the change of an angle, if the rotation speed is constant, a constant value is output. This will be the DC offset of the detection signal.

Figure 4C:
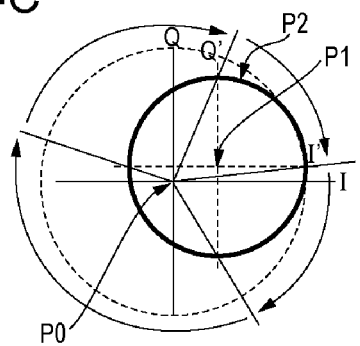

FIG. 4C shows a constellation in case that the origin of the quadrature detector 12 and the origin of the FM detector 18 do not agree with each other.

Figure 4D:
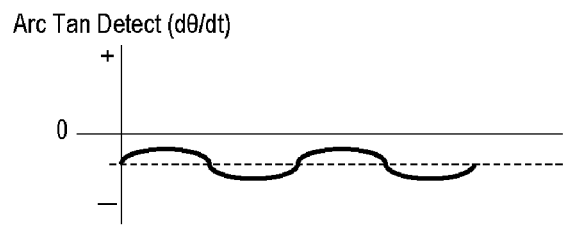

In the figure, "P0" indicates the origin of the quadrature detector 12, "P1" indicates the origin of the FM detector 18, and "P2" indicates a detection signal. If the frequencies of an RF signal and a local oscillation signal deviate from each other, a point on the Cartesian coordinate system rotates at a speed according to the deviation of the frequencies. FIG. 4D shows the time variation of a detection signal. If the deviation frequency is constant, the rotation speed is constant. Arctan detection detects the change of an angle. However, since the origins on Cartesian coordinate systems do not coincide, angles detected by the FM detector 18 differ even if the rotation speed is constant. Thus, the modulation is performed according to the extent of the change. As a result, a beat noise caused by the deviation of origins occurs as shown in the figure. An explanation will be continued while referring back to FIG. 1.

The third LPF unit 60 performs a low-pass-filtering process on the detection signal generated in the FM detector 18. This corresponds to derivation of an average value of the detection signal. Therefore, in the third LPF unit 60, a DC component of a detection signal (i.e., the frequency difference between an RF signal and a local oscillation signal) is detected. The fourth amplifier 62 generates a control signal by amplifying a signal from the third LPF unit 60. The amplification in the fourth amplifier 62 determines the gain of an AFC loop. In this manner, the AFC unit 20 generates a control signal for controlling the frequency of a local oscillation signal to be used in quadrature detection on the basis of the detection signal generated in the FM detector 18. That is, the AFC unit 20 performs a control to equalize the frequency of the local oscillator 24 and the frequency of an RF signal.

A more concrete explanation on the AFC control will be given here. The voltage of a detection signal in case that a frequency fin of an RF signal and a frequency flo of a local oscillation signal agree with each other is defined as a center voltage V0. If the voltage of the detection signal is higher than V0 in case that the frequency difference (flo−fin) is positive, and if the oscillation frequency becomes higher in case that the voltage of a control signal input into the local oscillator 24 increases, the voltage of the detection signal will be higher than V0 if the frequency difference (flo−fin) becomes positive. As a result, a control is performed so as to decrease the voltage of the control signal in order to decrease the frequency of the local oscillation signal. Thereby, the frequency difference df becomes 0 and the frequency of the beat noise also becomes 0 Hz. Thus, the beat noise becomes inaudible as a sound. If the AFC is executed, the AFC responds even to an FM signal where a modulated signal having a frequency lower than the audible frequency (e.g., a CTCSS, a DCS or the like) is superimposed. The response of the AFC operates as cancellation of a demodulation signal, and the CTCSS and/or the DCS are attenuated or distorted.

The DAC unit 22 performs a digital-analog conversion on a control signal from the fourth amplifier 62 and outputs the control signal of an analog signal (hereinafter also referred to as a "control signal") to the local oscillator 24. That is, the AFC unit 20 feeds back a control signal to the local oscillator 24 that should output a local oscillation signal.

The controller 26 detects a time point when the power of the receiver 100 is turned on, and a time point when the receiver 100 starts receiving an RF signal. These time points are referred collectively as "start timing." Since known art can be used for the detection of start timing, the explanation thereof is omitted here. The controller 26 notifies the difference calculator 28 of the start timing of a process. In this manner, the controller 26 controls the operation of the difference calculator 28.

The difference calculator 28 inputs a signal from the third LPF unit 60, i.e., a detection signal on which a low-pass-filtering process is performed in the third LPF unit 60. At the start timing of a process notified by the controller 26, the difference calculator 28 acquires and stores a detection signal on which a low-pass-filtering process is performed in the third LPF unit 60 as a reference value. After having stored the reference value, the difference calculator 28 sequentially generates as a difference signal a difference between a detection signal, on which a low-pass-filtering process is performed in the third LPF unit 60, and the reference value. That is, the difference calculator 28 generates a difference signal on difference from the reference value on the basis of the detection signal generated in the FM detector 18. The difference calculator 28 outputs the difference signal to the addition unit 30.

The addition unit 30 adds the difference signal generated in the difference calculator 28 and the detection signal generated in the FM detector 18. This corresponds to operation of canceling output voltage variation of the FM detector 18 by the AFC unit 20.

This configuration is implemented in hardware by a CPU of a computer, memory, or other LSI's, and in software by a program loaded in memory, etc. The figure depicts functional blocks implemented by cooperation of these components. Therefore, it will be obvious to those skilled in the art that the functional blocks may be implemented in a variety of ways, by hardware only, software only, or a combination thereof.

An explanation on the operation of the receiver 100 with the aforementioned configuration will be given below. FIG. 5 shows a flowchart indicating a procedure of reception by the receiver 100. If the controller 26 detects the start of reception (Y in S10), the difference calculator 28 acquires the reference value (S12). If the controller 26 does not detect the start of reception (N in S10), the difference calculator 28 generates a difference signal by calculating the subtraction of the reference value from the output value of the third LPF unit 60 (S14). The difference calculator 28 outputs the difference signal (S16).

According to the present exemplary embodiment, since the frequency of an RF signal and the frequency of a local oscillation signal get closer to each other by the AFC, a beat noise can be reduced. Further, since the difference between a detection signal on which a low-pass-filtering process is performed and a reference value is added to a detection signal, attenuation of a signal for tone squelch is suppressed. Further, since a detection signal at start timing of a process, on which a low-pass-filtering process is performed, is stored as a reference value, accuracy of processing can be improved. Further, in an FM receiver of a direct conversion type, the effects of a beat noise occurred by an unnecessary DC component that is superimposed on an I signal and a Q signal can be reduced. Further, distortion and/or attenuation of a low-frequency signal in an audio signal after FM detection can be reduced. Further, as a measure against attenuation and/or distortion of a signal for tone squelch after FM detection due to tracking of the signal for tone squelch by the AFC in case that the signal for tone squelch is included in an RF signal, a difference signal is added. Therefore, the signal for tone squelch can be recovered. Further, since the signal for tone squelch is recovered, squelch operation can be performed normally.

Given above is an explanation based on the exemplary embodiment. The exemplary embodiment is intended to be illustrative only and it will be obvious to those skilled in the art that various modifications to constituting elements and processes could be developed and that such modifications are also within the scope of the present invention.

What is claimed is:

1. An FM receiver comprising:
    a quadrature detection device that quadrature-detects an FM signal;
    an FM detector that generates a detection signal by FM detecting an FM signal that has been quadrature-detected in the quadrature detection device;
    an AFC unit that generates a control signal for controlling a frequency of a local oscillation signal used in the quadrature detection device on the basis of the detection signal generated in the FM detector, and feeds back the control signal to a local oscillator that should output the local oscillation signal;
    a difference calculator that generates a differential signal between the detection signal and a reference value that generated the detection signal of a predetermined timing in the FM detector; and
    an addition unit that adds the difference signal generated in the difference calculator and the detection signal generated in the FM detector.

2. The FM receiver according to claim 1 further comprising a controller that controls an operation of the difference calculator,
    wherein the AFC unit comprises:
        a low pass filter that performs a low-pass-filtering process on the detection signal generated in the FM detector;
    wherein the controller notifies the difference calculator of start timing of reception as said predetermined timing, and
    wherein the difference calculator acquires, at said predetermined timing, the signal from the low pass filter as a reference value, and generates as a difference signal a difference between the signal from the low pass filter and the reference value sequentially.

3. A method for receiving an FM signal comprising:
    quadrature-detecting an FM signal;
    generating a detection signal by FM detecting an FM signal that has been quadrature-detected;
    generating a control signal for controlling a frequency of a local oscillation signal used in the quadrature-detecting on the basis of the generated detection signal, and feeding back the control signal to a local oscillator that should output the local oscillation signal;
    storing the detection signal generated at a predetermined timing as a reference value;
    generating a difference signal between the generated detection signal and the reference value; and
    adding the generated difference signal and the generated detection signal.

* * * * *